US012780254B2

(12) United States Patent
Porav et al.

(10) Patent No.: US 12,780,254 B2
(45) Date of Patent: Nov. 3, 2026

(54) CONTROLLING AN AUTONOMOUS VEHICLE

(71) Applicant: Oxa Autonomy Ltd, Oxford (GB)

(72) Inventors: Horia Porav, Oxford (GB); Ben Upcroft, Oxford (GB); Paul Newman, Oxford (GB); Alex Stewart, Oxford (GB)

(73) Assignee: Oxa Autonomy Ltd, Oxford (GB)

( * ) Notice: Subject to any disclaimer, the term of this patent is extended or adjusted under 35 U.S.C. 154(b) by 36 days.

(21) Appl. No.: 18/862,511

(22) PCT Filed: May 2, 2023

(86) PCT No.: PCT/GB2023/051160
§ 371 (c)(1),
(2) Date: Nov. 1, 2024

(87) PCT Pub. No.: WO2023/214159
PCT Pub. Date: Nov. 9, 2023

(65) Prior Publication Data

US 2025/0282384 A1 Sep. 11, 2025

(30) Foreign Application Priority Data

May 3, 2022 (GB) ...................................... 2206452

(51) Int. Cl.
*B60W 60/00* (2020.01)
*B60W 40/04* (2006.01)
*G06F 30/15* (2020.01)

(52) U.S. Cl.
CPC ........ *B60W 60/0015* (2020.02); *B60W 40/04* (2013.01); *B60W 60/0011* (2020.02); *G06F 30/15* (2020.01); *B60W 2554/802* (2020.02)

(58) Field of Classification Search
CPC .......... B60W 60/0011; B60W 30/0953; G08G 1/166; G08G 1/096816; G06N 3/045;
(Continued)

(56) References Cited

U.S. PATENT DOCUMENTS 11,537,902 B1 * 12/2022 Aydore ................ G06N 3/0455
11,577,741 B1 * 2/2023 Reschka ........... B60W 30/0953
(Continued)

FOREIGN PATENT DOCUMENTS

CN 111369605 A 7/2020
CN 112721909 A 4/2021
(Continued)

OTHER PUBLICATIONS

International Preliminary Report for Patentability for International Application No. PCT/GB2023/051160, Issued Oct. 29, 2024, 10 pgs.

(Continued)

*Primary Examiner* — Yuri Kan
(74) *Attorney, Agent, or Firm* — KPPB LLP

(57) ABSTRACT

The present invention relates to a computer-implemented method of controlling an autonomous vehicle. The method comprises: receiving current sensor data defining a current scenario; determining a distance between the current scenario and a closest scenario from a database of known scenarios; and controlling the autonomous vehicle by: manoeuvring the autonomous vehicle within a manoeuvring constraint associated with the closest scenario when the distance is below a first threshold; performing a minimal risk manoeuvre when the distance is above a second threshold, wherein the second threshold is greater than the first threshold; and interpolating the manoeuvring constraint associated with the closest scenario when the distance is between the first threshold and the second threshold, and manoeuvring (Continued)

the autonomous vehicle within the interpolated manoeuvring constraint.

7 Claims, 9 Drawing Sheets

(58) Field of Classification Search
CPC .. G06N 3/0475; G06N 3/0455; G06F 18/241; G06F 11/3698; G05D 1/0221; H04L 63/1416; G01C 21/3407
See application file for complete search history.

(56) References Cited

U.S. PATENT DOCUMENTS

| | | | | |
|---|---|---|---|---|
| 11,648,961 | B2 * | 5/2023 | Shi | G01C 21/3407 701/26 |
| 12,028,362 | B1 * | 7/2024 | Cui | H04L 63/1416 |
| 2005/0286767 | A1 | 12/2005 | Hager et al. | |
| 2014/0204081 | A1 | 7/2014 | Dobes et al. | |
| 2015/0211868 | A1 | 7/2015 | Matsushita et al. | |
| 2017/0076455 | A1 | 3/2017 | Newman et al. | |
| 2018/0196436 | A1 | 7/2018 | Gupta | |
| 2019/0129436 | A1 | 5/2019 | Sun et al. | |
| 2019/0129831 | A1 * | 5/2019 | Goldberg | G06F 11/3698 |
| 2019/0318040 | A1 | 10/2019 | Chaudhury et al. | |
| 2019/0355257 | A1 | 11/2019 | Caldwell et al. | |
| 2020/0026296 | A1 | 1/2020 | Hoedt | |
| 2020/0139959 | A1 | 5/2020 | Akella et al. | |
| 2020/0264619 | A1 * | 8/2020 | Joseph | G08G 1/096816 |
| 2020/0278686 | A1 | 9/2020 | Liu et al. | |
| 2020/0293826 | A1 | 9/2020 | Liu et al. | |
| 2020/0301419 | A1 * | 9/2020 | Joseph | G05D 1/0221 |
| 2020/0341474 | A1 | 10/2020 | Zuo | |
| 2020/0379481 | A1 | 12/2020 | Newman et al. | |
| 2021/0009119 | A1 | 1/2021 | Nattermann et al. | |
| 2021/0078603 | A1 * | 3/2021 | Nakhaei Sarvedani | G06N 3/0475 |
| 2021/0108936 | A1 | 4/2021 | Seegmiller et al. | |
| 2021/0139048 | A1 | 5/2021 | Russell et al. | |
| 2021/0208596 | A1 | 7/2021 | Tong et al. | |
| 2021/0216077 | A1 | 7/2021 | Zhang | |
| 2021/0253128 | A1 | 8/2021 | Nister et al. | |
| 2021/0302974 | A1 | 9/2021 | Di Cairano et al. | |
| 2021/0302982 | A1 | 9/2021 | Yasui et al. | |
| 2021/0387617 | A1 | 12/2021 | Bauch et al. | |
| 2021/0387647 | A1 | 12/2021 | Koopman, Jr. | |
| 2022/0032960 | A1 | 2/2022 | Wang et al. | |
| 2022/0048533 | A1 | 2/2022 | Ödblom | |
| 2022/0048535 | A1 | 2/2022 | Niendorf et al. | |
| 2022/0055651 | A1 | 2/2022 | Baric et al. | |
| 2022/0108049 | A1 | 4/2022 | Letwin et al. | |
| 2022/0169278 | A1 | 6/2022 | Refaat et al. | |
| 2022/0185266 | A1 | 6/2022 | Shah | |
| 2022/0185302 | A1 | 6/2022 | Dev et al. | |
| 2022/0194395 | A1 | 6/2022 | Venkatadri et al. | |
| 2022/0230536 | A1 | 7/2022 | Tkachenko et al. | |
| 2022/0309292 | A1 * | 9/2022 | Albrecht | G06F 18/241 |
| 2022/0383985 | A1 * | 12/2022 | Theis | G06N 3/045 |
| 2023/0365131 | A1 * | 11/2023 | Do | G08G 1/166 |
| 2025/0278608 | A1 | 9/2025 | Porav et al. | |
| 2025/0377211 | A1 | 12/2025 | Stewart et al. | |

FOREIGN PATENT DOCUMENTS

| | | | |
|---|---|---|---|
| CN | 114331879 | A | 4/2022 |
| DE | 102019133970 | A1 | 6/2021 |
| EP | 3372467 | A1 | 9/2018 |
| GB | 2598408 | B | 2/2023 |
| JP | 2004333157 | A | 11/2004 |
| JP | 2018062237 | A | 4/2018 |
| JP | 2020106904 | A | 7/2020 |
| JP | 2021057012 | A | 4/2021 |
| JP | 2021160371 | A | 10/2021 |
| JP | 2022030664 | A | 2/2022 |
| RU | 2658679 | C1 | 6/2018 |
| WO | 2019140367 | A1 | 7/2019 |
| WO | 2019141992 | A1 | 7/2019 |
| WO | 2020061603 | A1 | 4/2020 |
| WO | 2021071810 | A1 | 4/2021 |
| WO | 2021092702 | A1 | 5/2021 |
| WO | 2021164615 | A1 | 8/2021 |
| WO | 2021183256 | A1 | 9/2021 |
| WO | 2021262308 | A1 | 12/2021 |
| WO | 2023062390 | A1 | 4/2023 |
| WO | 2023062392 | A1 | 4/2023 |
| WO | 2023062393 | A1 | 4/2023 |
| WO | 2023062394 | A1 | 4/2023 |
| WO | 2023067325 | A1 | 4/2023 |
| WO | 2023067326 | A1 | 4/2023 |
| WO | 2023067327 | A1 | 4/2023 |
| WO | 2023214159 | A1 | 11/2023 |
| WO | 2023214160 | A1 | 11/2023 |
| WO | 2023247924 | A1 | 12/2023 |

OTHER PUBLICATIONS

International Preliminary Report on Patentability for International Application No. PCT/GB2023/051162, Issued Oct. 29, 2024, 9 pgs.
International Preliminary Report on Patentability for International Application No. PCT/GB2023/051419, Issued Dec. 18, 2024, 7 pgs.
International Search Report and Written Opinion for International Application No. PCT/GB2023/051419, Search completed Jul. 13, 2023, Mailed Jul. 7, 2023, 9 Pgs.
Easa et al., "Optimal Speed Plan for the Overtaking of Autonomous Vehicles on Two-Lane Highways", Infrastructures, 2020, vol. 5, No. 44, doi:10.3390/infrastructures5050044.
Ghariblu et al., "Trajectory Planning of Autonomous Vehicle in Freeway Driving", Transport and Telecommunication, 2021, vol. 22, No. 3, 278-286, DOI 10.2478/ttj-2021-0021.
Hegedus et al., "Graph-Based Multi-Vehicle Overtaking Strategy for Autonomous Vehicles", IFAC PapersOnLine, 2019, vol. 52, No. 5, p. 372-377.
Huang et al., "A Path Planning Method for Vehicle Overtaking Maneuver Using Sigmoid Functions", IFAC PapersOnLinel, 2019, vol. 52, No. 8, pp. 422-427.
Jimenez et al., "Autonomous Manoeuvring Systems for Collision Avoidance on Single Carriageway Roads", Sensors, 2012, vol. 12, p. 16498-16521; doi:10.3390/s121216498.
Kala et al., "Reactive Planning of Autonomous Vehicles for Traffic Scenarios", Electronics, 2015, vol. 4, p. 739-762; doi:10.3390/electronics4040739.
Killing et al., "Learning to Robustly Negotiate Bi-Directional Lane Usage in High-Conflict Driving Scenarios", IEEE, arXiv:2013.12070v1[cs.LG], Mar. 22, 2021, pp. 7.
Li et al., "Dynamically Integrated Spatiotemporal-Based Trajectory Planning and Control for Autonomous Vehicles", IET Intelligent Transport Systems, Sep. 27, 2018, vol. 12, Iss. 10, pp. 1271-1282, doi: 10.1049/iet-its.2018.5306.
Li et al., "Evaluation Model of Autonomous Vehicles' Speed Suitability Based on Overtaking Frequency", Sensors, 2021, vol. 21, No. 371, doi.org/10.3390/s21020371, pp. 16.
Li et al., "Trajectory Control for Autonomous Electric Vehicles with In-Wheel Motors Based on a Dynamics Model Approach", IET Intelligent Transport Systems, 2016, vol. 10, Iss. 5, pp. 318-330, doi: 10.1049/iet-its.2015.0159.
Lin et al., "A Vision-Based Driver Assistance System with Forward Collision and Overtaking Detection", Sensors, 2020, vol. 20, vol. 5139; doi:10.3390/s20185139, 19pgs.
Liu et al., "Heuristics-Oriented Overtaking Decision Making for Autonomous Vehicles using Reinforcement Learning", IET Electrical Systems in Transportation, Nov. 13, 2020, vol. 10 Iss. 4, pp. 417-424, doi:10.1049/iet-est.2020.0044.
Ma et al., "Unpaired Image-to-Speech synthesis with multimodal information bottleneck", 2019 IEEE/CVF International Conference on Computer Vision (ICCV), DOI 10.1109/ICCV.2019.00769. 10 pgs.
Parida et al., "Discriminative sematic transitive consistency for cross-mode learning", arXiv:2103.14103v2 [cs.CV] Mar. 20, 2022.

(56) References Cited

OTHER PUBLICATIONS

Receveur et al., "Multi-Criteria Trajectory Optimization for Autonomous Vehicles", IFAC PapersOnLine, 2017, vol. 50, No. 1, p. 12520-12525, 10.1016/j.ifacol.2017.08.2063.
Schucker et al., "Linear Time-Variant Vehicle Trajectory Guidance with Nonlinear Inversion-Based Feedforward Control", IFAC PapersOnLine, 2019, vol. 52, No. 5, p. 378-384.
Sumarli et al., "Braking and Acceleration Mapping Control for Autonomous Overtaking to Avoid Fatality Crash in Undivided Road", Journal of Physics: Conference Series, ICOVEMAT 2020, vol. 1700, No. 012037, doi:10.1088/1742-6596/1700/1/012037, pp. 12.
Examination Report for GB Patent Application No. 2114809.3, Apr. 11, 2022, 5 pgs.
Examination Report under Section 18(3) for GB Patent Application No. 2206457.0, dated Jun. 13, 2024, 6 pgs.
Examination Report under Sections 17 and 18(3) for GB Patent Application No. 2206452.1, dated Nov. 1, 2022, 7 pgs.
Examination Report under Sections 17 and 18(3) for GB Patent Application No. 2206457.0, dated Oct. 26, 2022, 7 pgs.
Examination Report under Sections 17 and 18(3) for GB Patent Application No. 2303083.6, dated Mar. 27, 2023, 5 pgs.
GB Patent Application No. 2114945.5, Jun. 21, 2022, 19 pgs.
International Preliminary Patentability Report for International Application No. PCT/GB2022/0052652, Apr. 23, 2024, 12 pgs.
International Preliminary Report on International Application No. PCT/GB2022/052640, Issued Apr. 16, 2024, 7 pgs.
International Preliminary Report on Patentability for International Application No. PCT/GB2022/052630, Issued Apr. 16, 2024, 10 pgs.
International Preliminary Report on Patentability for International Application No. PCT/GB2022/052636, Report Issued Apr. 16, 2024, 7 pgs.
International Preliminary Report on Patentability for International Application No. PCT/GB2022/052650, Apr. 23, 2024, 18 pgs.
International Preliminary Report on Patentability for International Application No. PCT/GB2022/052651, Apr. 23, 2024, 19 pgs.
International Preliminary Report on Patentability for International Application No. PCT/GB2022/52639, Issued Apr. 16, 2024, 7 pgs.
International Search Report and Written Opinion for International Application No. PCT/GB2022/0052652, Search completed Jan. 9, 2023, Mailed Jan. 20, 2023, 14 Pgs.
International Search Report and Written Opinion for International Application No. PCT/GB2022/052630, Search completed Jan. 10, 2023, Mailed Jan. 20, 2023, 12 Pgs.
International Search Report and Written Opinion for International Application No. PCT/GB2022/052636, Search completed Dec. 21, 2022, Mailed Jan. 5, 2023, 11 Pgs.
International Search Report and Written Opinion for International Application No. PCT/GB2022/052640, Search completed Jan. 3, 2023, Mailed Jan. 18, 2023, 09 Pgs.
International Search Report and Written Opinion for International Application No. PCT/GB2022/052650, Search completed Jan. 12, 2023, Mailed Jan. 20, 2023, 26 Pgs.
International Search Report and Written Opinion for International Application No. PCT/GB2022/052651, Search completed Jan. 13, 2023, Mailed Jan. 31, 2023, 23 Pgs.
International Search Report and Written Opinion for International Application No. PCT/GB2022/52639, Search completed Dec. 29, 2022, Mailed Jan. 18, 2023, 09 Pgs.
International Search Report and Written Opinion for International Application No. PCT/GB2023/051160, Search completed Oct. 16, 2023, Mailed Oct. 25, 2023, 20 Pgs.
International Search Report and Written Opinion for International Application No. PCT/GB2023/051162, Search completed Jun. 14, 2023, Mailed Jun. 21, 2023, 4 Pgs.
Search Report and Written Opinion for GB Application No. 2114808.5, Search completed May 27, 2022, 9 pgs.
Search Report for GB Patent Application No. 2114944.8, Jul. 29, 2022, 12 pgs.
Behzadan et al., "Adversarial Reinforcement Learning Framework for Benchmarking Collision Avoidance Mechanisms in Autonomous Vehicles", arXiv:1806.01368v1 [cs.RO] Jun. 4, 2018.
Bosse et al., "Keypoint design and evaluation for place recognition in 2D lidar maps", Robotics and Autonomous Systems, Elsevier BV, Amsterdam, NL, vol. 57, No. 12, Dec. 31, 2009 (Dec. 31, 2009), pp. 1211-1224, XP026746016, ISSN: 0921-8890, DOI: 10.1016/J.ROBOT.2009.07.009.
Brownlee, "How to Calculate Principal Component Analysis (PCA) from Scratch in Python", https://machinelearningmastery.com/, Aug. 9, 2019, pp. 1-28, XP055924999, Retrieved from the Internet: URL:https://machinelearningmastery.com/calculate-principalcomponent-analysis-scratch-python/.
Cen et al., "Precise Ego-Motion Estimation with Millimeter-Wave Radar Under Diverse and Challenging Conditions", 2018 IEEE International Conference on Robotics and Automation (ICRA), May 21, 2018, pp. 1-8, XP033403205, DOI: 10.1109/ICRA.2018.8460687.
Cen et al., "Radar-only ego-motion estimation in difficult settings via graph matching", 2019 International Conference on Robotics and Automation (ICRA), IEEE, May 20, 2019, pp. 298-304, XP033593985, DOI:10.1109/ICRA.2019.8793990.
Chen et al., "GeoSim: Realistic Video Simulation via Geometry-Aware Composition for Self-Driving", Proceedings of the IEEE/CVF Conference on Computer Vision and Pattern Recognition (CVPR), 2021, pp. 7230-7240.
De Martini et al., "kRadar++: Coarse-to-Fine FMCW Scanning Radar Localisation", Sensors, MDPI, CH, Nov. 1, 2020, vol. 20, No. 21, pp. 1-23, XP009535871, ISSN: 1424-8220, DOI: 10.3390/S20216002.
Ding et al., "CMTS: A Conditional Multiple Trajectory Synthesizer for Generating Safety-Critical Driving Scenarios", arXiv:1910.00099v2 [cs.LG] Oct. 2, 2019.
Ding et al., "Learning to Collide: An Adaptive Safety-Critical Scenarios Generating Method", arxiv.org, Cornell University Library, Cornell University Ithaca, NY 14853, Jul. 23, 2020, XP081706097.
Gawel et al., "Structure-based vision-laser matching", 2016 IEEE/RSJ International Conference on Intelligent Robots and Systems (IROS), IEEE, Oct. 9, 2016, pp. 182-188, XP033011403, DOI: 10.1109/IROS.2016.7759053.
Gleave et al., "Adversarial Policies: Attacking Deep Reinforcement Learning", arXiv:1905.10615v3 [cs. LG] Jan. 17, 2021.
Himstedt et al., "Large scale place recognition in 2D LIDAR scans using Geometrical Landmark Relations", 2014 IEEE/RSJ International Conference on Intelligent Robots and Systems, IEEE, Sep. 14, 2014, pp. 5030-5035, XP032676853, DOI: 10.1109/IROS.2014.6943277.
Koren et al., "Adaptive Stress Testing for Autonomous Vehicles", arXiv:1902.01909v1 [cs.RO] Feb. 5, 2019.
Koren et al., "The Adaptive Stress Testing Formulation", arXiv:2004.04293v1 [cs.RO] Apr. 8, 2020.
Kuhnl, "Road Terrain Detection for Advanced Driver Assistance System", May 21, 2013, pp. 1-152, XP055117968, Retrieved from the Internet: URL:http://pub.uni-bielefeld.de/luur/download?func=downloadFile&recordOld=2633277&fileOld=2633278.
Kuutti et al., "Training Adversarial Agents to Exploit Weaknesses in Deep Control Policies", arXiv:2002.12078v1 [cs.LG] Feb. 27, 2020.
Lee et al., "Adaptive Stress Testing: Finding Likely Failure Events with Reinforcement Learning", arxiv.org, Cornell University Library, 201 Olin Library Cornell University Ithaca, NY 14853, Dec. 4, 2020, XP081829250.
Machida et al., "Deep Photo Relighting by Integrating Both 2D and 3D Lighting Information", 2020 25th International Conference on Pattern Recognition (ICPR), IEEE, Jan. 10, 2021 (Jan. 10, 2021), pp. 8446-8452, XP033908865, DOI: 10.1109/ICPR48806.2021.9413179.
Park et al., "Semantic Image Synthesis with Spatially-Adaptive Normalization", arXiv:1903.07291v2 [cs.CV] Nov. 5, 2019.
Porav et al., "Adversarial Training for Adverse Conditions: Robust Metric Localisation using Appearance Transfer", arXiv:1803.03341v1 [cs.CV] Mar. 9, 2018.

(56) References Cited

OTHER PUBLICATIONS

Porav et al., "Don't Worry About the Weather: Unsupervised Condition-Dependent Domain Adaptation", arXiv:1907.11004v1 [cs.CV], Jul. 25, 2019, Retrieved from: https://arxiv.org/pdf/1907.11004, 8 pgs.

Porav et al., "Don't Worry About the Weather: Unsupervised Condition-Dependent Domain Adaptation", 2019 IEEE Intelligent Transportation Systems Conference (ITSC), IEEE, Oct. 27, 2019, pp. 33-40, XP033668402, DOI:10.1109/ITSC.2019.8917073.

Prakash et al., "Multi-Modal Fusion Transformer for End-to-End Autonomous Driving", 2021 IEEE/CVF Conference on Computer Vision and Pattern Recognition (CVPR) DOI 10.1109/CVPR46437.2021.00700, 2021.

Qi et al., "Semi-parametric Image Synthesis", arXiv:1804.10992v1 [cs.CV] Apr. 29, 2018.

Ren et al., "Learning Traffic Behaviors by Extracting Vehicle Trajectories from Online Video Streams", 2018 IEEE 14th International Conference on Automation Science and Engineering (CASE), published 2018, IEEE, pp. 1276-1283.

Sarlin et al., "From Coarse to Fine: Robust Hierarchical Localization at Large Scale", rxiv.org, Cornell University Library, 201 OLIN Library Cornell University Ithaca, NY 14853, Dec. 9, 2018, XP081200041.

Shu et al., "Bottleneck Conditional Density Estimation", arxiv.org, Cornell University Library, 201 Olin Library Cornell University Ithaca, NY 14853, Nov. 25, 2016, XP080734635.

Shu et al., "Bottleneck Conditional Density Estimation", arXiv:1611.08568v3 [stat.ML] Jun. 30, 2017.

Uricar et al., "Yes, we GAN: Applying Adversarial Techniques for Autonomous Driving", arxiv.org, Cornell University Library, 201 Olin Library Cornell University Ithaca, NY 14853, Feb. 9, 2019, XP081590898, DOI:10.2352/ISSN.2470-1173.2019.15.AVM-048.

Wang et al., "AdvSim: Generating Safety-Critical Scenarios for Self-Driving Vehicles", 2021 IEEE/CVF Conference on Computer Vision and Pattern Recognition (CVPR), 2021.

Wang et al., "High-Resolution Image Synthesis and Semantic Manipulation with Conditional GANs", arXiv:1711.11585v2 [cs.CV] Aug. 20, 2018.

Xu et al., "Worst Perception Scenario Search for Autonomous Driving", 2020 IEEE Intelligent Vehicles Symposium (IV), IEEE, Oct. 19, 2020, pp. 1702-1707, XP033872685, DOI: 10.1109/IV47402.2020.9304731.

Zlocki, , "Securing Automated Driving—The Database Approach in PEGASUS", Conference connected and Automated Driving Together, Shaping the Future : Day 1, Session: Vehicle Validation/Certification Roadworthiness Testing, Apr. 3, 2017.

* cited by examiner

CONTROLLING AN AUTONOMOUS VEHICLE

CROSS-REFERENCE TO RELATED APPLICATIONS

The current application is U.S. National Stage of PCT Patent Application Serial No. PCT/GB2023/051160 filed May 2, 2023, entitled "Controlling an Autonomous Vehicle", which claims priority to U.K. Patent Application Serial No. 2206452.1 filed May 3, 2022 entitled "Controlling an Autonomous Vehicle". The disclosures of which are hereby incorporated by reference in their entireties.

FIELD

The subject-matter of the present disclosure relates to a computer a computer-implemented method of controlling an autonomous vehicle, a computer-implemented method of determining a manoeuvring constraint of an autonomous vehicle during a known scenario, and a transitory, or non-transitory, computer-readable medium.

BACKGROUND

An autonomous vehicle (AV) may capture a plurality of scenarios. Each scenario may be associated with a travel envelope. When the AV encounters a scenario in real time, it is able to traverse within the travel envelope of a matching scenario.

A problem exists where there are no known scenario matches.

It is an aim of the present invention to address such problems and improve on the prior art.

SUMMARY

According to an aspect of the present disclosure, there is provided a computer-implemented method of controlling an autonomous vehicle. The method comprises: receiving current sensor data defining a current scenario; determining a distance between the current scenario and a closest scenario from a database of known scenarios; and controlling the autonomous vehicle by: manoeuvring the autonomous vehicle within a manoeuvring constraint associated with the closest scenario when the distance is below a first threshold; performing a minimal risk manoeuvre when the distance is above a second threshold, wherein the second threshold is greater than the first threshold; and interpolating the manoeuvring constraint associated with the closest scenario when the distance is between the first threshold and the second threshold, and manoeuvring the autonomous vehicle within the interpolated manoeuvring constraint.

In an embodiment, the current scenario and each known scenario may be a descriptor representing a multivariable distribution from a bottleneck of a variational autoencoder.

In an embodiment, the determining the distance may comprise calculating a distance using a plurality of weighted matchers.

In an embodiment, the plurality of weighted matchers may comprise one or more of: a time warping matcher, a Euclidian distance matcher, and a learned matcher.

In an embodiment, the manoeuvring constraint may comprise a travel envelope constructed in space-time, within which no infractions are predicted to occur.

In an embodiment, the minimal risk manoeuvre may comprise one or more of an emergency stop and pulling over to a road side.

According to an aspect of the invention, there is provided a computer-implemented method of determining a manoeuvring constraint of an autonomous vehicle during a known scenario. The method comprises: running a known scenario of the autonomous vehicle as a simulation in a simulator; iteratively running the simulation by applying different dynamic parameters to the autonomous vehicle; and identifying a maximum dynamic parameter from the different dynamic parameters the autonomous vehicle below which no infractions occur during the simulation and above which an infraction occurs during the simulation; and storing, in a constraint database, the maximum dynamic parameter as a manoeuvring constraint of the autonomous vehicle for the known scenario.

In an embodiment, the computer-implemented method further comprises: retrieving a descriptor of the known scenario from a database, the descriptor being a multivariate distribution from a bottleneck of a variational autoencoder; and decoding the descriptor using a decoder from the variational autoencoder to generate the known scenario.

In an embodiment, the iteratively running the simulation may comprise: incrementing and/or decrementing the dynamic parameters; and checking for infractions at each increment and/or decrement.

In an embodiment, the computer-implemented method may further comprise: continuing the incrementing and/or decrementing until modulation of the dynamic parameters has been exhausted.

In an embodiment, the incrementing and/or decrementing may comprise incrementing and/or decrementing at a pre-defined interval.

In an embodiment, the dynamic parameters may be selected from a list including velocity, acceleration, deceleration, and jerk.

In an embodiment, the manoeuvring constraint comprises a travel envelope constructed in space-time, within which no infractions are predicted to occur.

According to a further aspect of the invention, there is provided a transitory, or non-transitory, computer-readable medium having instructions stored thereon that, when executed by a processor, cause the processor to perform the computer-implemented method of any preceding claim.

BRIEF DESCRIPTION OF DRAWINGS

The subject-matter of the present disclosure is best described with reference to the accompanying figures, in which.

DESCRIPTION OF EMBODIMENTS

The embodiments described herein are embodied as sets of instructions stored as electronic data in one or more storage media. Specifically, the instructions may be provided on a transitory or non-transitory computer-readable media. When executed by the processor, the processor is configured to perform the various methods described in the following embodiments. In this way, the methods may be computer-implemented methods. In particular, the processor and a storage including the instructions may be incorporated into a vehicle. The vehicle may be an AV.

Whilst the following embodiments provide specific illustrative examples, those illustrative examples should not be taken as limiting, and the scope of protection is defined by the claims. Features from specific embodiments may be used in combination with features from other embodiments without extending the subject-matter beyond the content of the present disclosure.

Figure 1:
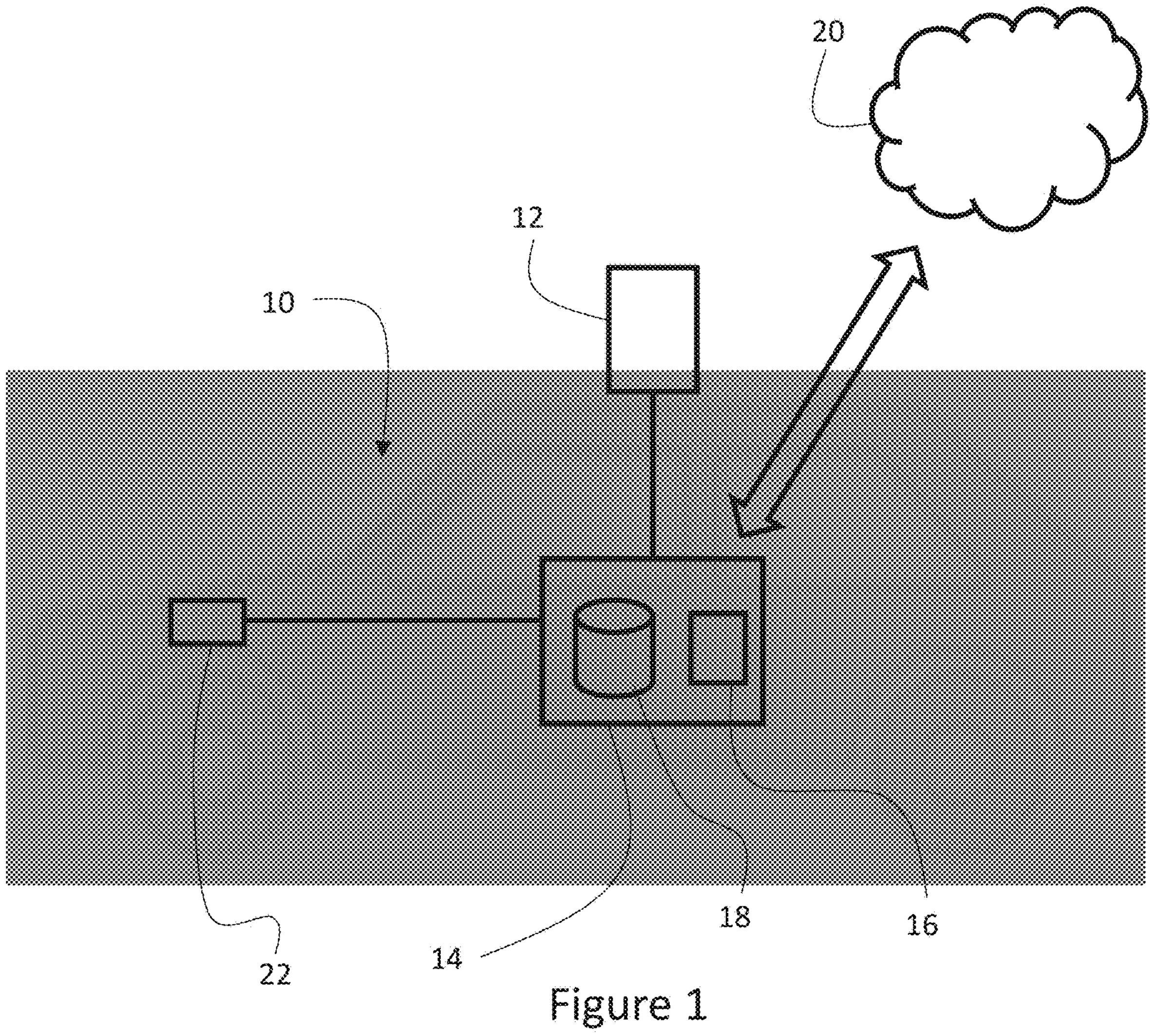
FIG. 1 shows a schematic of an AV according to one or more embodiments.

With reference to FIG. 1, an AV 10 may include a plurality of sensors 12. The sensors 12 may be mounted on a roof of the AV 10. The sensors 12 may be communicatively connected to a computer 14. The computer 14 may be onboard the AV 10. The computer 14 may include a processor 16 and a memory 18. The memory may include the non-transitory computer-readable media described above. Alternatively, the non-transitory computer-readable media may be located remotely and may be communicatively linked to the computer 14 via the cloud 20. The computer 14 may be communicatively linked to one or more actuators 22 for control thereof to move the AV 10. The actuators may include, for example, a motor, a braking system, a power steering system, etc.

The sensors 12 may include various sensor types. Examples of sensor types include LiDAR sensors, RADAR sensors, and cameras. Each sensor type may be referred to as a sensor modality. Each sensor type may record data associated with the sensor modality. For example, the LiDAR sensor may record LiDAR modality data.

The data may capture various scenes that the AV 10 encounters. For example, a scene may be a visible scene around the AV 10 and may include roads, buildings, weather, objects (e.g. other vehicles, pedestrians, animals, etc.), etc.

Figure 2:
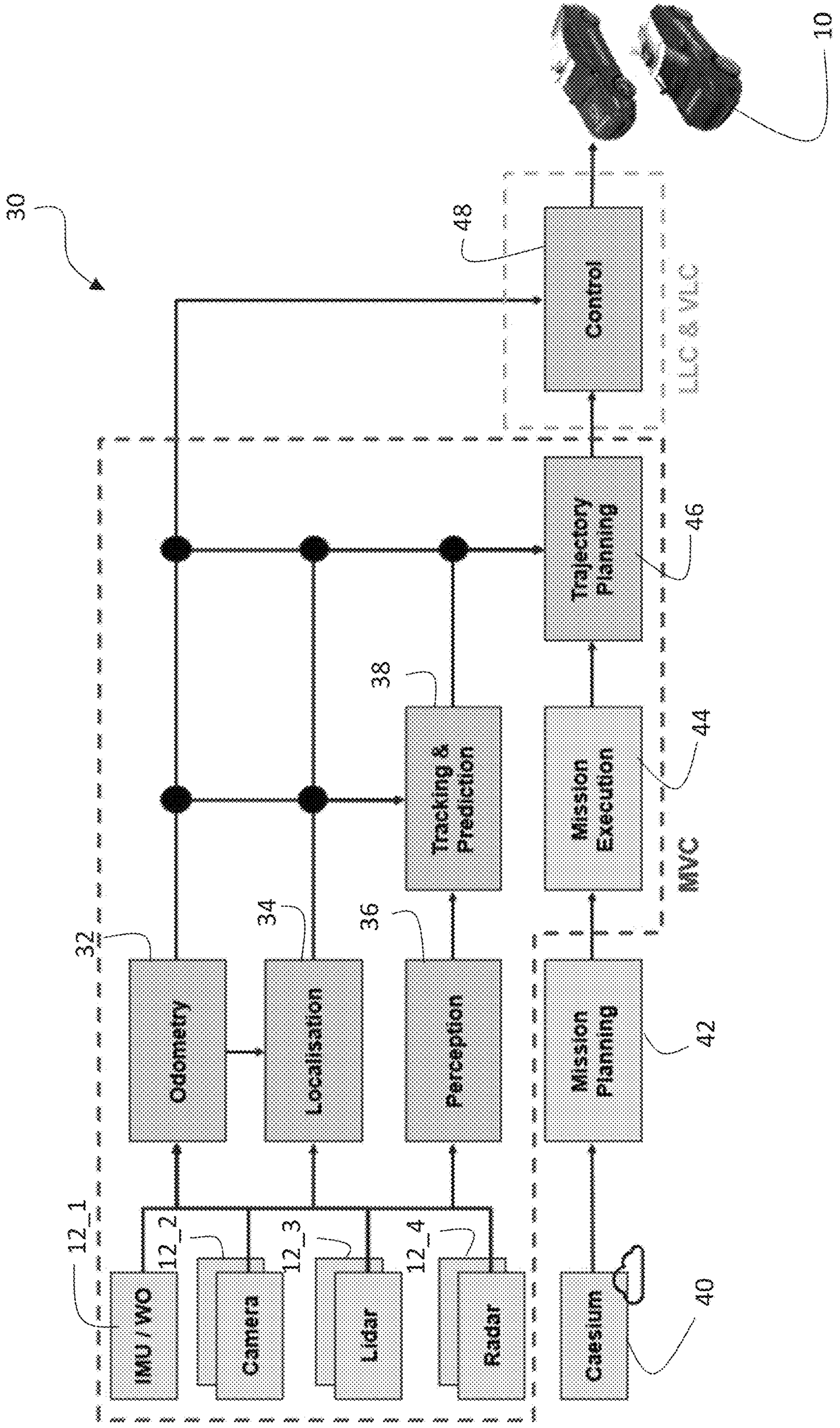
FIG. 2 shows a block diagram of features used by the methods described herein.

With reference to FIG. 2, a vehicle control system 30 comprises the plurality of sensors 12. The plurality of sensors 12 includes an inertial measurement unit (IMU) 12_1, a camera 12_2, a LiDAR sensor 12_3, and a radar sensor 12_4. The vehicle control system 30 also comprises an odometry module 32, a localisation module 34, a perception module 36, and a tracking and prediction module 38. The system 30 also comprises a high-level instruction module 40, a mission planning module 42, a mission execution module 44, a trajectory planning module 46, and a controller 48.

The IMU 12_1 may include an accelerometer and a gyroscope, for example.

The odometry module 32 may be configured to estimate a position of the AV 10 over time relative to a reference point (e.g. a starting point) using inputs from the plurality of sensors 12.

The localisation module 34 may be confirmed to estimate a global pose of the AV 10 within its environment using inputs from the plurality of sensors 12.

The perception module 36 may be configured to generate models of the AV's 10 environment, including objects within the environment. The models may include segmentation maps, bounding boxed, cuboids, depth perception, etc., using inputs from the plurality of sensors 12.

The tracking and prediction module 38 may be configured to track objects (static and dynamic) within a scene based on the outputs from the odometry module 32, the localisation module 34, and the perception module 36.

The high-level instructions module 40 may be configured to receive an input from a user regarding a route, e.g. a destination, and output a command to move the AV 10 from the current location to a destination, e.g. from point A to B.

The mission planning module 42 may include a map, and when in cooperation with the mission planning module 42, may be configured to construct a route that will execute the route from the high-level instructions module 40. The route may be a travel envelope within which the AV 10 must travel to traverse the route successfully.

The trajectory planning module 46 may be configured to plan a trajectory for the AV 10 that is within the travel envelope defined by the mission execution module 44, taking account of objects' trajectories and positions from the tracking and prediction module, and the position of the AV 10 from the odometry and localisation modules 32, 34.

The controller 48 may be configured to control one or more actuators of the AV 10 to implement the trajectory from the trajectory planning module 46.

Figure 3:
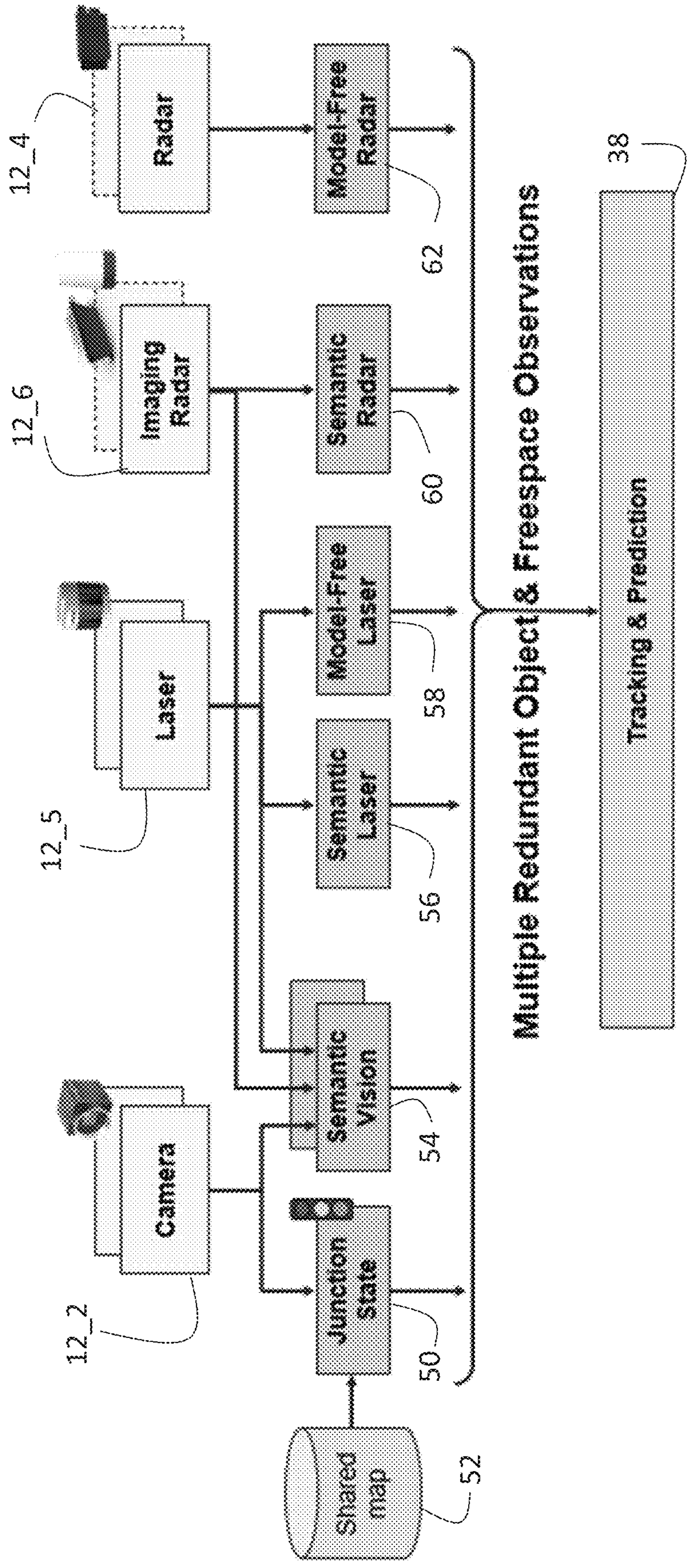
FIG. 3 shows a block diagram of features used for determining tracking and prediction of objects within a scenario captured by sensors of the AV from FIG. 1.

With reference to FIG. 3, features from the vehicle control system 30 are shown in more detail. In particular, FIG. 3 shows a flow chart for determining the tracking and prediction of objects based on real time, online, sensor data. By online, we mean when the AV 10 is active in its field, or environment.

The sensors 12, including the camera 12_2 and the radar 12_4, may also include a laser 12_5 and an imaging radar 12_6.

The camera 12_2 images may be used to generate a junction state 50 in combination with a shared map 52. A junction may be defined as an area whose access state changes dynamically. By access state we mean whether the AV 10 is able to access to area being controlled. Examples of junctions include traffic lights, pelican crossings, zebra crossings, give-way markings, etc.

The camera 12_2, laser 12_5, and imaging radar 12_6 data, may be used to generate a semantic vision 54. The term semantic used herein may generally refer to something in the form of a class or an embedding. Semantic vision may include embeddings of objects viewed in the visual, camera image, modality.

The laser 12_5 may be used to generate a semantic laser 56. This may mean an embedding associated with laser points in the laser domain.

The laser may also be used to generate a model-free laser 58. The term model-free may generally be used herein to mean raw data points from a particular modality. The model-free laser may be raw laser points.

The imaging radar 12_6 may be used to generate a semantic radar. The semantic radar 60 may be embeddings defining features captured by the imaging radar 12_6. As used herein, the term semantic may mean a first representation processed into a second representation bearing semantic information.

The radar 12_5 may be used to generate a model-free radar 62. The model-free radar may include raw radar points.

The junction state 50, semantic vision 54, semantic laser 56, model-free laser 58, semantic radar 60, and model-free radar 62, may be used to generate the tracking and prediction module 38.

Figure 4:
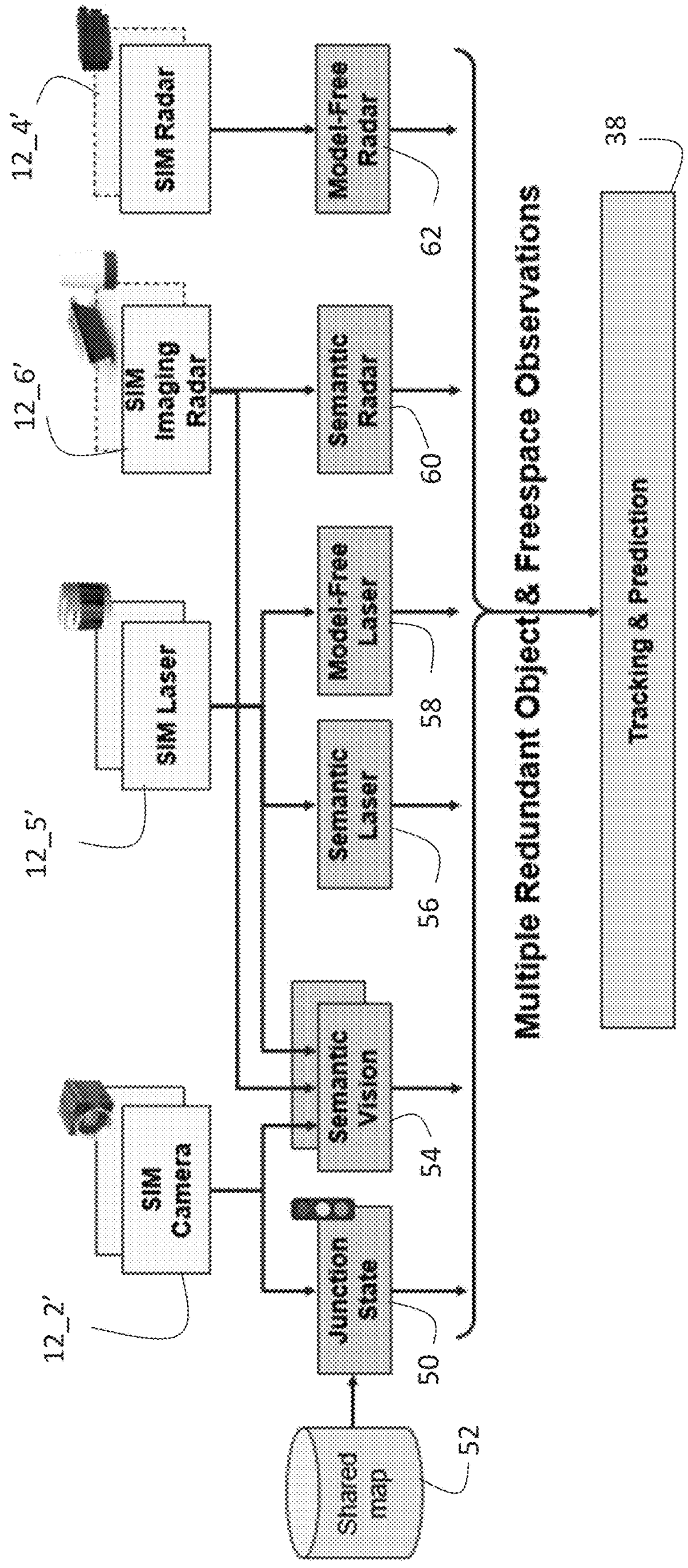
FIG. 4 shows a block diagram of features used for determining tracking and prediction of objects within scenes within a simulator.

FIG. 4 shows a similar diagram to FIG. 3, except the inputs are simulated inputs. In this way, the tracking and prediction module 38 uses data from a simulated camera 12_2', a simulated laser 12_5', a simulated imaging radar 12_6', and a simulated radar 12_4'.

Figure 5:
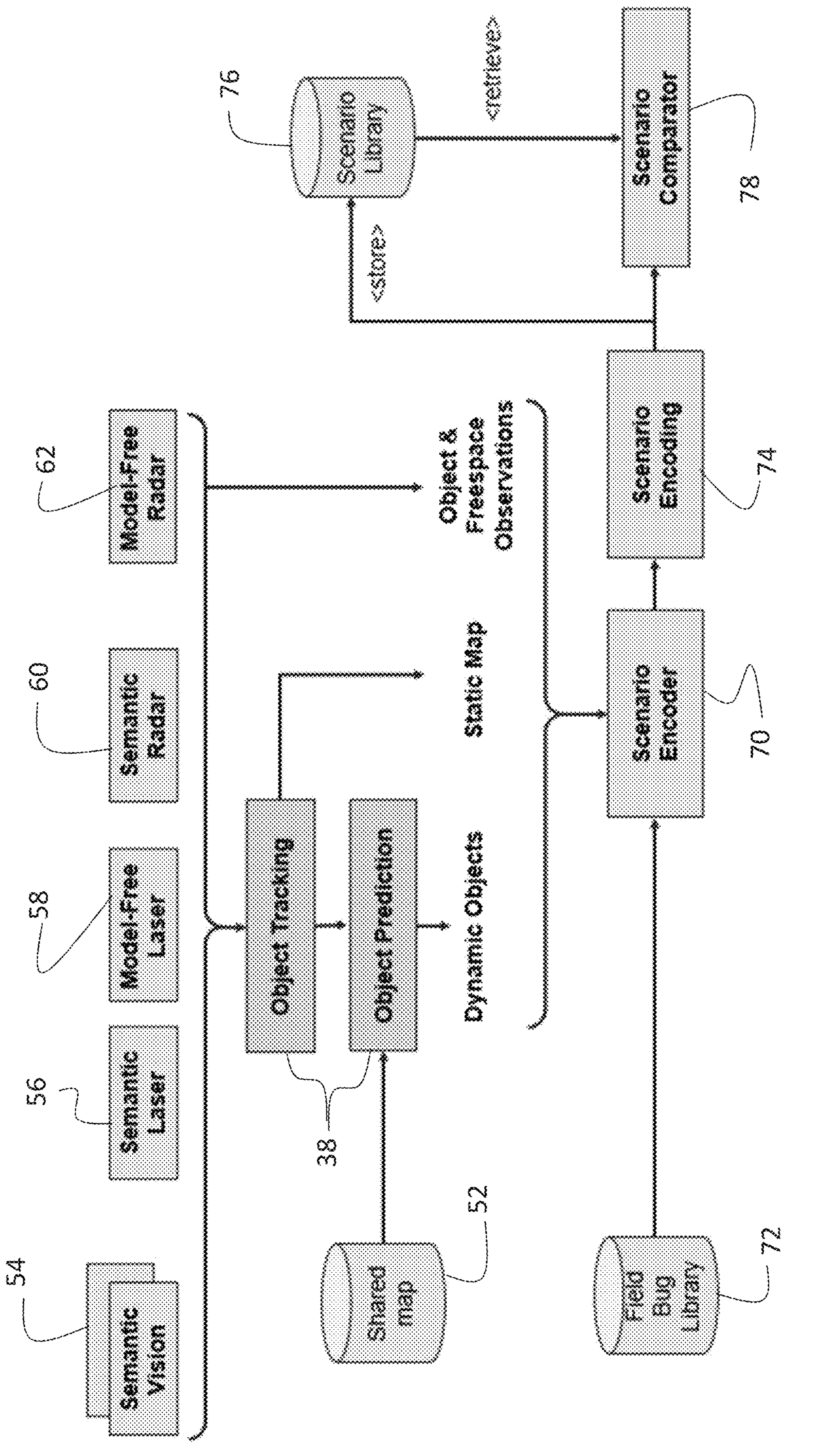
FIG. 5 shows a block diagram of features used for training a scenario encoder.

With reference to FIG. 5, a flow chart is shown to explain how to train an encoder to generate a scenario encoding.

The tracking and prediction module 38 has determined positions of static objects and positions and trajectories of dynamic objects, which are input together with object and freespace data (derived from model-free data) into a scenario encoder 70. The term freespace is used to mean a travel envelope which avoids infractions. The travel envelope may be in space time. Infractions represent events that either reduce the safety of operation or reduce the perceived quality of operation. Infractions may include collisions and harsh braking, for example.

The scenario encoder 70 may receive a further input from a field bug library 72. The field bug library 72 is a database which includes recorded responses of the AV 10 to infractions online. The scenario encoder 70 may be an autoencoder. The autoencoder may be a variational autoencoder (VAE). A multivariable distribution may be extracted at a bottleneck of the VAE and used as a scenario encoding 74.

The scenario encoding 74 may be stored in a scenario library 76.

A scenario comparator 78 may also be provided. The scenario comparator 78 may be configured to compare the scenario encoding 74 to the other known scenarios included in the scenario library 76. The scenario encoder 70 may be trained in a supervised manner to generate scenario encodings 74 which may match known scenarios of the same scene, for example.

Figure 6:
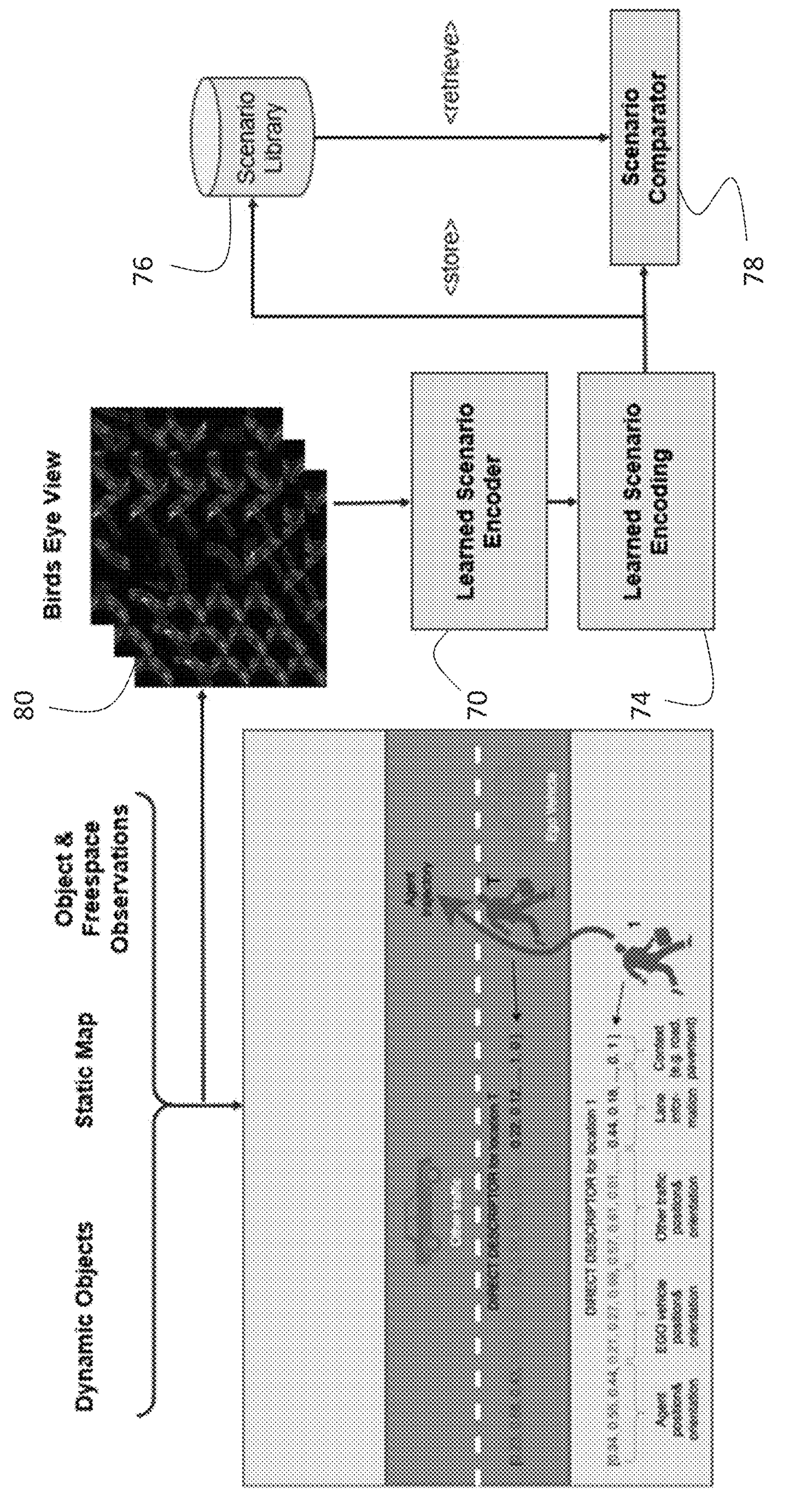
FIG. 6 shows a block diagram of features used for comparing scenarios using the trained scenario encoder from FIG. 5.

FIG. 6 shows a flow chart explaining how additional scenarios are encoded online using the scenario encoder 70 trained by the method outlined with reference to FIG. 5.

Online, the dynamic objects, static objects (or static map), and freespace observations, are combined into a bird's eye view 80. The bird's eye view 80 may be a representation of a scene from a reference point. The reference point may be from above. Additionally, the bird's eye view may be constructed entirely from spatio-temporal sensor readings from the AV itself, e.g. single "frame" LIDAR/RADAR scans or multiple scans integrated over time.

The bird's eye view 80 may be used as an input to the learned scenario encoder 70, which generates a scenario encoding 74. The scenario encoding may be compared with known scenarios from the scenario library 76 using the scenario comparator 78.

Figure 7:
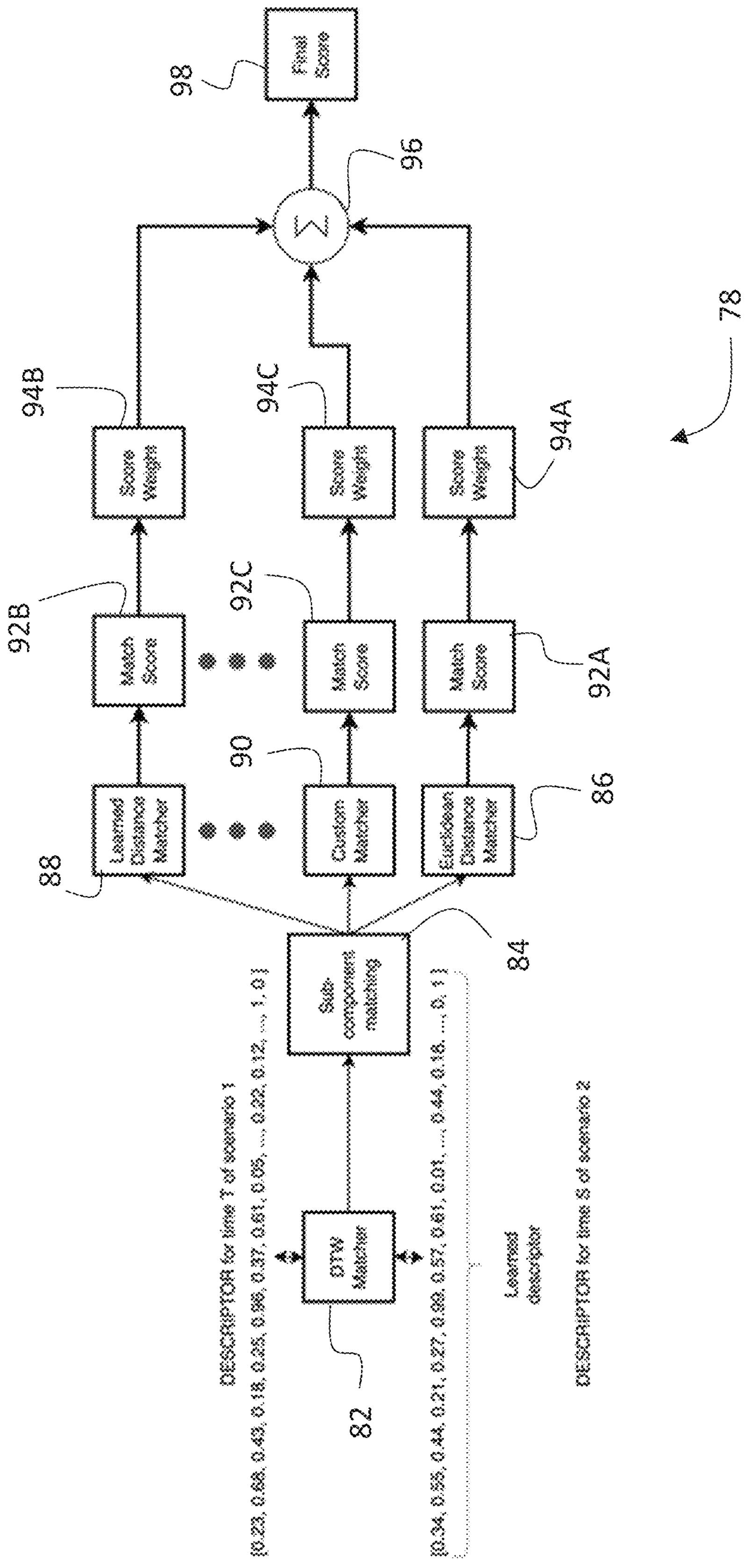
FIG. 7 shows a block diagram of the scenario comparator shown in FIG. 6.

With reference to FIG. 7, the scenario comparator 78 is a matcher. The matcher may include a plurality of matching means. For example, a dynamic time warping (DTW) matcher 82 may be used to compare points from each compared encoding in time.

And output from the DTW matcher 82 may be input to a sub-component matcher 84 which distributes the paired points from the DTW matcher 82 to the plurality of matching means. The plurality of matching means each computes a distance between respective points in the pairs.

The matching means may comprises a Euclidian distance matcher 86, a learned distance matcher 88 and a custom matcher 90. The Euclidian distance matcher 86 calculates a Euclidian distance between points of compared encodings. The learned distance matcher 88 may be a neural network trained using contrastive learning to compute a distance between points of compared encodings. The custom matcher may calculate the distance by comparing a hybrid weighted similarity between different heuristics.

The output of the respective matching means is a match score 92A, 92B, 92C. The match score may be a numerical value. A respective score weight 94A, 94B, 94C, may be applied to each match score. The term "apply" may be used to mean multiply. A summation block 96 may add the weighted match scores to generate a final score 98. The score weights may be different. The score weights may be predetermined. In other embodiments, the score weights may be learned. For example, the score weights may be adjusted using an optimisation algorithm on training samples having a desired final score for a particular encoding pair.

Figure 8:
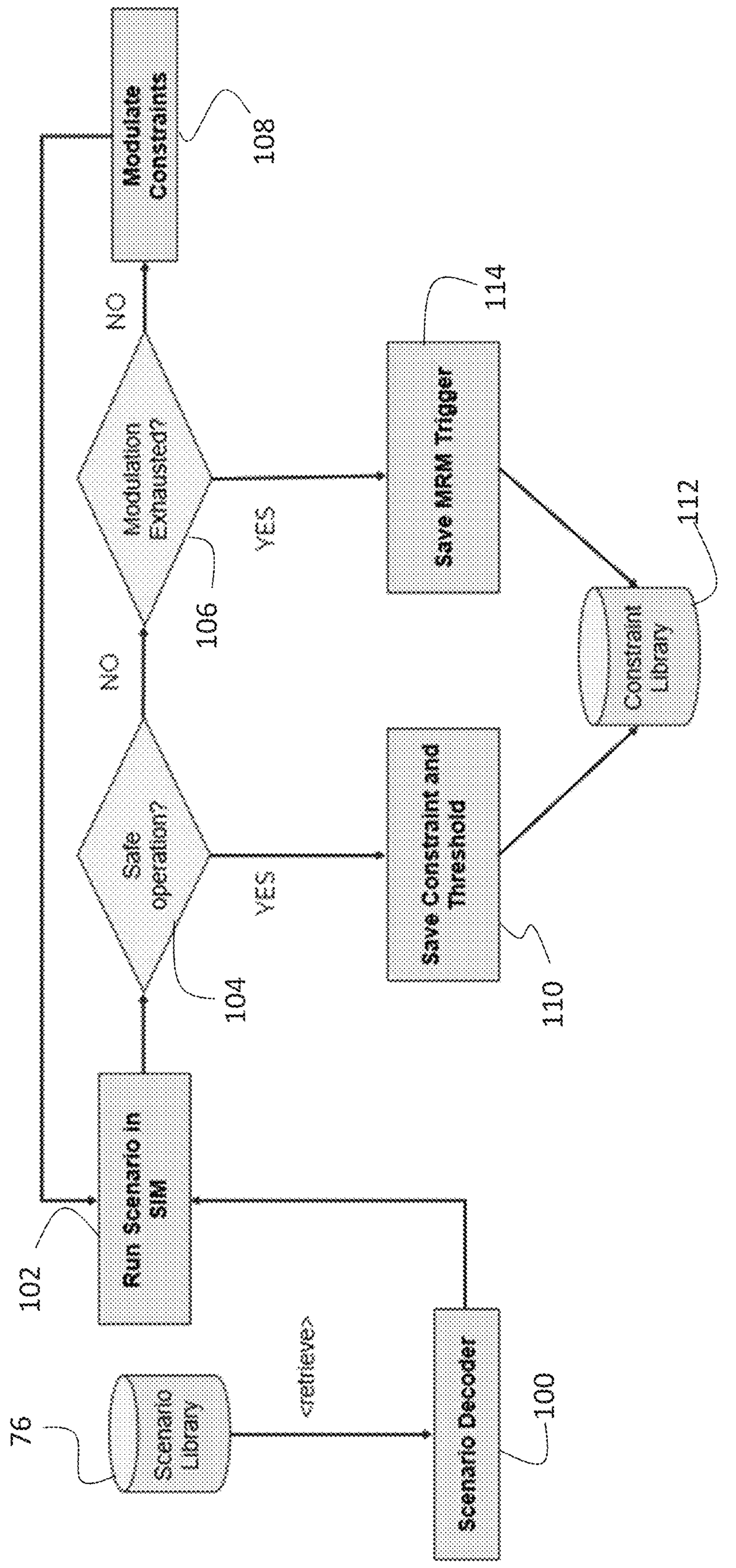
FIG. 8 shows a flow chart of a method of determining a manoeuvring constraint according to one or more embodiments.

With reference to FIG. 8, there is provided a flow chart outlining a computer-implemented method of determining a manoeuvring constraint of an autonomous vehicle during a known scenario according to one or more embodiments.

At step 100, the method comprises retrieving a descriptor of the known scenario from the scenario library 76 stored in a database, the descriptor being a multivariate distribution from a bottleneck of a variational autoencoder as described above. Also at step 100, the descriptor is decoded by a decoder. The decoder may be from the variational autoencoder used to generate the known scenario.

At step 102, the method comprises running the known scenario of the AV as a simulation in a simulator (SIM). The SIM is run iteratively by applying different dynamic parameters to the AV. The dynamic parameters may be selected from a list including velocity, acceleration, deceleration, and jerk.

A first set of dynamic parameters may be applied to the AV in the known scenario. For example, the AV may be travelling at 20 miles per hour (mph) with zero acceleration. At step 104, safe operation of the AV is checked. Safe operation may be understood as meaning that there are no infractions. An infraction may be an event which adversely affects the user's perception of safe driving. Infractions may include collisions with objections within a scenario. Infractions may also include near misses, e.g. where the AV comes within a predetermined distance of another object in the scenario. These examples are non-exhaustive and are included for illustrative purposes only.

If there are infractions, at step 106, the method comprises checking if the dynamic parameters are at their limits. In other words, there is a check to determine if modulation of the dynamic parameters has been exhausted. For example, if the current speed is 20 mph, it is possible to decrement the speed. The decremented (or increments) may be at a predefined interval. The decrements may be at an interval of 5 mph.

At step 108, the method comprises modulating the dynamic parameters. In the above example, the new iteration of speed may be 15 mph.

At step 104, safe operation of the AV is again checked at the new speed iteration, e.g. 15 mph.

The method continues by iteratively running the simulation by incrementing and/or decrementing the dynamic parameters; and checking for infractions at each increment and/or decrement. The method continues incrementing and/or decrementing the dynamic parameters until modulation of the dynamic parameters has been exhausted. For example, the dynamic parameter speed may be exhausted when the speed of the AV is 5 mph.

When step 104 determines that the operation is safe, the maximum dynamic parameter of the AV below which no infractions occur, and above which an infraction occurs, during the SIM, is identified at step 110.

At step 112, the maximum dynamic parameter is stored as a manoeuvring constraint of the AV for the known scenario, in a constraint library. A manoeuvring constraint may comprise a travel envelope constructed in space-time (e.g. using a space-time graph), within which no infractions are predicted to occur.

Otherwise, where the modulation has been exhausted at step 106, the minimum dynamic parameter may be determined as a trigger for initiating a minimal risk manoeuvre (MRM). A minimal risk manoeuvre may include an emergency brake event or pulling to the side of the road, for example. These MR examples are non-exhaustive and are included here for illustrative purposes only.

At step 114, the MRM trigger is identified.

At step 112, the MRM is stored in the constraint library.

Figure 9:
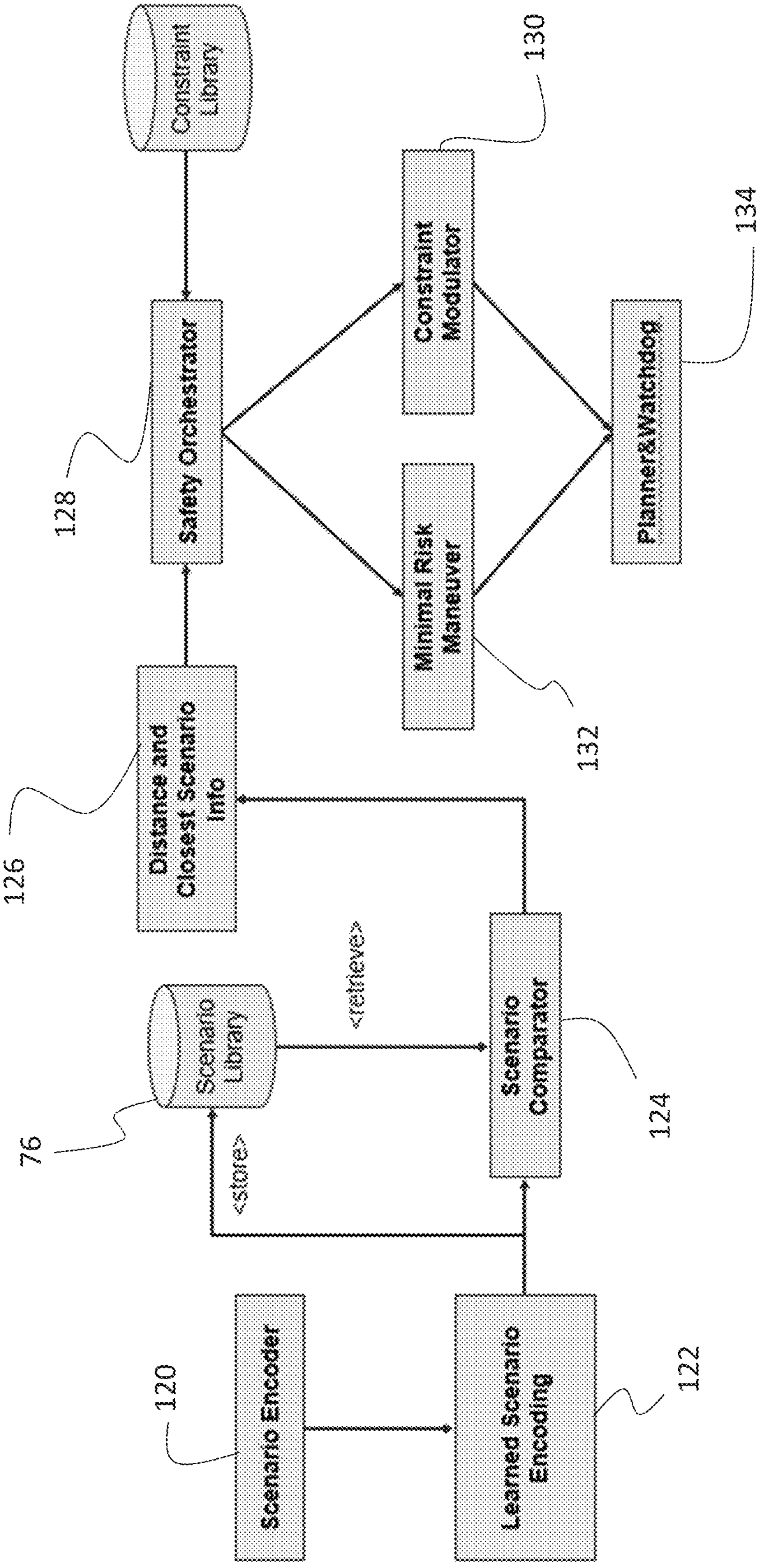
FIG. 9 shows a flow chart of a method of controlling the AV from FIG. 1.

With reference to FIG. 9, there is provided a computer-implemented method of controlling an autonomous vehicle according to one or more embodiments.

The method comprises, at step 120, encoding the current scenario using the encoder.

At step 122, the encoding is obtained from the encoded scenario.

At step 124, the encoding of the current scenario is compared with known scenarios from the scenario library. The comparison may be made using the matcher from FIG. 7. In this way, determining the distance comprises calculating a distance using a plurality of weighted matchers. The comparisons may be exhaustive in that all known scenarios are compared. In other embodiments, the known scenarios may be clustered in the scenario library using an unsupervised clustering model to group similar scenarios together. In this way, fewer comparisons need to be made.

As described above, the current scenario and each known scenario may be a descriptor representing a multivariable distribution from a bottleneck of a variational autoencoder.

At step 126, the distance between the current scenario and a closest known scenario from the database of known scenarios (scenario library) is determined.

At step 128, a safety orchestrator is used to determine a manoeuvre to be carried out by the AV. The safety orchestrator retrieves the manoeuvring constraint associated with the closest known scenario from the constraint library from FIG. 8.

The safety orchestrator may decide it is best to proceed to step 130 and control the AV by manoeuvring the autonomous vehicle within a manoeuvring constraint associated with the closest scenario when the distance is below a first threshold. In other words, the manoeuvring constraint of the closest scenario may be used as the manoeuvring constraint for the current scenario. The manoeuvring constraint may comprise a travel envelope constructed in space-time, within which no infractions are predicted to occur.

The safety orchestrator may decide it is best to control the AV at step 132 by performing a minimal risk manoeuvre when the distance is above a second threshold. The second threshold is greater than the first threshold. The minimal risk manoeuvre may comprise one or more of an emergency stop and pulling over to a road side.

The safety orchestrator may decide it is best to interpolate, again at step 130, the manoeuvring constraint associated with the closest scenario when the distance is between the first threshold and the second threshold and manoeuvre the autonomous vehicle within the interpolated manoeuvring constraint.

Once the mode of implementation (e.g. harvesting the manoeuvring constraint from a closest scenario, interpolation, or by MRM) has been decided, at step 134, a planner determines control instructions for the AV's actuators to implement the mode of implementation. Simultaneously, a watchdog monitors the planner's actions. In certain circumstances, the watchdog may override the planner.

Whilst the foregoing embodiments have been described to illustrate the subject-matter of the present disclosure, the features of the embodiments are not to be taken as limiting the scope of protection. For the avoidance of doubt, the scope of protection is defined by the following claims.

The invention claimed is:

1. A computer-implemented method of controlling an autonomous vehicle, the method comprising:
- receiving current sensor data defining a current scenario;
- determining a distance between the current scenario and a closest scenario from a database of known scenarios, the distance being determined based on similarity between the current scenario and the closest scenario; and
- controlling the autonomous vehicle by:
  - maneuvering the autonomous vehicle within a maneuvering constraint associated with the closest scenario when the distance is below a first threshold;
  - performing a minimal risk maneuver when the distance is above a second threshold, wherein the second threshold is greater than the first threshold; and
  - interpolating the maneuvering constraint associated with the closest scenario when the distance is between the first threshold and the second threshold, and maneuvering the autonomous vehicle within the interpolated maneuvering constraint.

2. The computer-implemented method of claim 1, wherein the current scenario and each known scenario is a descriptor representing a multivariable distribution from a bottleneck of a variational autoencoder.

3. The computer-implemented method of claim 1, wherein determining the distance comprises calculating a distance using a plurality of weighted matchers.

4. The computer-implemented method of claim 3, wherein the plurality of weighted matchers comprises one or more of: a time warping matcher, a Euclidian distance matcher, a cosine distance matcher, and a learned matcher.

5. The computer-implemented method of claim 1, wherein the maneuvering constraint comprises a travel envelope constructed in space-time, within which no infractions are predicted to occur.

6. The computer-implemented method of claim 1, wherein the minimal risk maneuver comprises one or more of an emergency stop and pulling over to a road side.

7. A transitory, or non-transitory computer-readable medium having instructions stored thereon that, when executed by a processor, cause the processor to perform a computer-implemented method comprising:
- receiving current sensor data defining a current scenario;
- determining a distance between the current scenario and a closest scenario from a database of known scenarios, the distance being determined based on similarity between the current scenario and the closest scenario; and controlling an autonomous vehicle by:

maneuvering the autonomous vehicle within a maneuvering constraint associated with the closest scenario when the distance is below a first threshold;

performing a minimal risk maneuver when the distance is above a second threshold, wherein the second threshold is greater than the first threshold; and interpolating the maneuvering constraint associated with the closest scenario when the distance is between the first threshold and the second threshold, and maneuvering the autonomous vehicle within the interpolated maneuvering constraint.

* * * * *